(12) United States Patent
Shin et al.

(10) Patent No.: US 8,988,962 B2
(45) Date of Patent: Mar. 24, 2015

(54) REFRESH CIRCUIT OF A SEMICONDUCTOR MEMORY DEVICE AND REFRESH CONTROL METHOD OF THE SEMICONDUCTOR MEMORY DEVICE

(71) Applicant: Samsung Electronics Co., Ltd., Suwon-si (KR)

(72) Inventors: Sang-Ho Shin, Yongin-si (KR); Jung-Bae Lee, Seongnam-si (KR); Min-Jeung Cho, Yongin-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 135 days.

(21) Appl. No.: 13/749,687

(22) Filed: Jan. 25, 2013

(65) Prior Publication Data
US 2013/0201777 A1    Aug. 8, 2013

(30) Foreign Application Priority Data

Feb. 6, 2012    (KR) ........................ 10-2012-0011906

(51) Int. Cl.
G11C 7/00 (2006.01)
G11C 11/402 (2006.01)
G11C 11/406 (2006.01)

(52) U.S. Cl.
CPC ........ G11C 11/402 (2013.01); G11C 11/40618 (2013.01)
USPC . 365/222; 365/203; 365/230.02; 365/230.03; 365/236

(58) Field of Classification Search
CPC .. G11C 11/402; G11C 11/401; G11C 11/406; G11C 11/4063
USPC ................ 365/222, 203, 230.02, 230.03, 236
See application file for complete search history.

(56) References Cited

U.S. PATENT DOCUMENTS

| 5,627,791 | A | 5/1997 | Wright et al. |
| 6,381,188 | B1 | 4/2002 | Choi et al. |
| 6,859,407 | B1 * | 2/2005 | Suh .............................. 365/222 |
| 7,492,656 | B2 | 2/2009 | Kim et al. |
| 7,583,552 | B2 | 9/2009 | Remaklus, Jr. et al. |

FOREIGN PATENT DOCUMENTS

| KR | 10-2000-0052491 A | 8/2000 |
| KR | 10-2008-0080693 A | 9/2008 |

* cited by examiner

Primary Examiner — Thong Q Le
(74) Attorney, Agent, or Firm — Muir Patent Law, PLLC

(57) ABSTRACT

A refresh circuit and a semiconductor memory device including the refresh circuit are disclosed. The refresh circuit includes a mode register, a refresh controller and a multiplexer circuit. The mode register generates a mode register signal having information relating to a memory bank on which a refresh operation is to be performed. The refresh controller generates a self-refresh active command and a self-refresh address based on a self-refresh command and an oscillation signal. The multiplexer circuit may include a plurality of multiplexers. Each of the multiplexers selects one of an active command and the self-refresh active command in response to bits of the mode register signal. Each of the multiplexers generates a row active signal based on the selected command, and selects one of an external address and the self-refresh address to generate a row address.

20 Claims, 10 Drawing Sheets

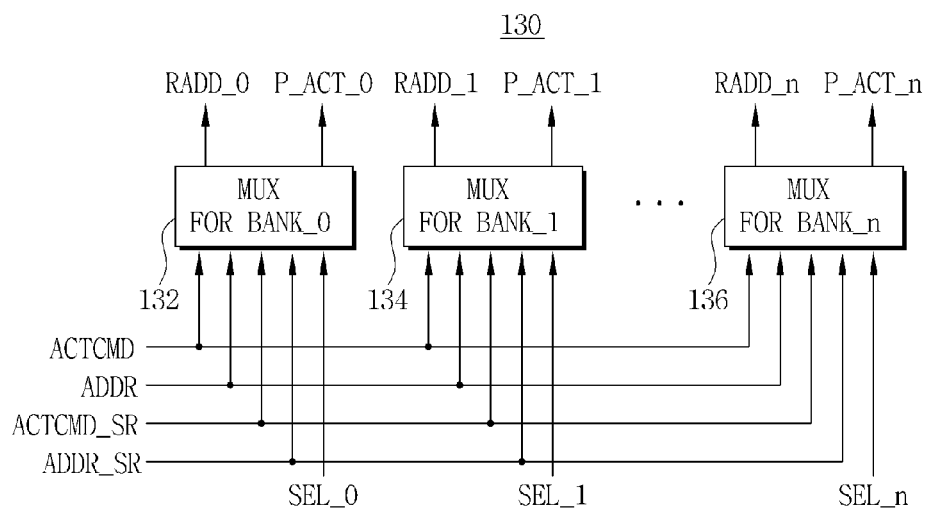

| MRS_B7 | MRS_B6 | MRS_B5 | MRS_B4 | MRS_B3 | MRS_B2 | MRS_B1 | MRS_B0 |
|---|---|---|---|---|---|---|---|
| 1 | 1 | 1 | 1 | 1 | 1 | 1 | 1 |
| REG7 | REG6 | REG5 | REG4 | REG3 | REG2 | REG1 | REG0 |

| MRS_B7 | MRS_B6 | MRS_B5 | MRS_B4 | MRS_B3 | MRS_B2 | MRS_B1 | MRS_B0 |
|---|---|---|---|---|---|---|---|
| 1 | 1 | 1 | 1 | 0 | 0 | 0 | 0 |
| REG7 | REG6 | REG5 | REG4 | REG3 | REG2 | REG1 | REG0 |

| MRS_B7 | MRS_B6 | MRS_B5 | MRS_B4 | MRS_B3 | MRS_B2 | MRS_B1 | MRS_B0 |
|---|---|---|---|---|---|---|---|
| 0 | 0 | 0 | 0 | 1 | 1 | 1 | 1 |
| REG7 | REG6 | REG5 | REG4 | REG3 | REG2 | REG1 | REG0 |

120d

REFRESH CIRCUIT OF A SEMICONDUCTOR MEMORY DEVICE AND REFRESH CONTROL METHOD OF THE SEMICONDUCTOR MEMORY DEVICE

CROSS-REFERENCE TO RELATED APPLICATION

This application claims priority under 35 U.S.C. §119 to Korean Patent Application No. 10-2012-0011906 filed on Feb. 6, 2012, the entire contents of which are incorporated herein by reference in their entirety.

BACKGROUND

Embodiments disclosed herein relate to a semiconductor device, and particularly, to a refresh circuit and refresh control method of a semiconductor memory device.

In a volatile memory such as dynamic random access memory (DRAM), when time has passed, charge stored in a memory cell gradually decreases and the data initially stored in the memory cell may be changed into another data. Therefore, an operation of charging memory cells of a volatile memory at predetermined periods is typically used. This process is called a refresh operation. Examples of a refresh operation are described in U.S. Pat. No. 5,627,791, which is incorporated herein by reference in its entirety.

SUMMARY

The embodiments disclosed herein provide a refresh circuit of a semiconductor memory device capable of increasing utilization efficiency of a memory cell array.

The disclosed embodiments also provide a semiconductor memory device including the refresh circuit.

The disclosed embodiments also provide a refresh control method of a semiconductor memory device capable of increasing utilization efficiency of a memory cell array.

The technical objectives of the inventive concept are not limited to the above disclosure; other objectives may become apparent to those of ordinary skill in the art based on the following descriptions.

In accordance with one embodiment, a refresh circuit includes a mode register, a refresh controller and a multiplexer circuit.

The mode register generates a mode register signal having information related to a memory bank on which a refresh operation is to be performed. The refresh controller generates a self-refresh active command and a self-refresh address based on a self-refresh command and an oscillation signal. The multiplexer circuit may include a plurality of multiplexers. Each of the multiplexers selects one of an active command and the self-refresh active command in response to bits of the mode register signal. Each of the multiplexers generates a row active signal based on the selected command, and selects one of an external address and the self-refresh address to generate a row address.

In an embodiment, the refresh circuit further comprises a bank selecting circuit configured to generate a selection signal based on the mode register signal to provide the selection signal to the multiplexer.

In another embodiment, the bank selecting circuit may include registers for storing bits of the mode register signal.

In another embodiment, each of the memory banks of the semiconductor memory device may be activated based on the row active signal and the row address generated by each of the multiplexers of the multiplexer circuit.

In still another embodiment, while parts of the memory banks of the semiconductor memory device undergo a refresh operation, the rest of the memory banks may undergo a normal operation.

In yet another embodiment, the normal operation may include an active operation, a write operation, a read operation, and a pre-charge operation.

In yet another embodiment, when the semiconductor memory device includes a first memory bank group and a second memory bank group, while the first memory bank group undergoes a refresh operation, the second memory bank group may undergo a normal operation.

In yet another embodiment, data retention time of the semiconductor memory device may be the sum of time for the first memory bank group to undergo the refresh operation, and time for the second memory bank group to undergo the normal operation.

In yet another embodiment, the data retention time of the semiconductor memory device may be longer than the time needed to refresh all the memory cells included in the first memory bank group once.

In yet another embodiment, a memory bank corresponding to a bit having a first logic state may undergo a refresh operation, and a memory bank corresponding to a bit having a second logic state may undergo a normal operation.

In yet another embodiment, the self-refresh command may have information on a self-refresh entry time and a self-refresh exit time with respect to memory banks.

In yet another embodiment, memory banks performing a self-refresh operation may enter a self-refresh mode and exit the self-refresh mode at least once during data retention time.

In accordance with another embodiment, a semiconductor memory device includes a memory cell array having a plurality of memory banks, a mode register, a refresh controller, a multiplexer circuit, a row decoder, a column address buffer, and a column decoder.

The mode register generates a mode register signal having information related to a memory bank on which a refresh operation is to be performed. The refresh controller generates a self-refresh active command and a self-refresh address based on a self-refresh command and an oscillation signal. The multiplexer circuit selects one of an active command and the self-refresh active command in response to bits of the selection signal, generates a row active signal based on the selected command, and selects one of an external address and the self-refresh address to generate a row address. The row decoder is configured to decode the row active signal and a row address. The column address buffer generates a column address based on the external address. The column decoder decodes the column address. While parts of the memory banks of the semiconductor memory device undergo a refresh operation, the rest of the memory banks undergo a normal operation based on an output signal of the row decoder.

In an embodiment, while a first memory bank group of the memory cell array undergoes a refresh operation, the rest of the memory bank groups may undergo a normal operation based on an output signal of the row decoder.

In an embodiment, the semiconductor memory device is a stacked memory device in which a plurality of chips communicates data and control signals by a through-silicon-via (TSV).

In accordance with another embodiment, a refresh control method of a semiconductor memory device includes generating a selection signal based on a mode register signal having information on a memory bank on which a refresh operation is to be performed, generating a self-refresh active command and a self-refresh address based on a self-refresh command and an oscillation signal, selecting one of an active command and the self-refresh active command in response to bits of the selection signal, generating a row active signal based on the selected command, selecting one of an external address and the self-refresh address to generate a row address, performing a refresh operation on a first memory bank group of the memory cell array based on the row active signal and the row address, and performing a normal operation on the rest of the memory banks based on the row active signal and the row address while the refresh operation is performed on the first memory bank group.

In another embodiment, a refresh method of a semiconductor memory device is disclosed. The refresh method includes: generating a mode register signal having information relating to a memory bank on which a refresh operation is to be performed; generating a self-refresh active command and a self-refresh address based on a self-refresh command and an oscillation signal; and for each of a plurality of multiplexers: selecting, by the multiplexer, one of an active command and the self-refresh active command in response to bits of the mode register signal, generating, by the multiplexer, a row active signal based on the selected command, and selecting one of an external address and the self-refresh address to generate a row address.

The refresh circuit and method according to certain embodiments may selectively refresh memory banks included in the memory cell array. Further, in the refresh circuit according to certain embodiments, while parts of the memory banks of the semiconductor memory device undergo a refresh operation, the rest of the memory banks may undergo a normal operation.

Accordingly, the semiconductor memory device including the refresh circuit according to disclosed embodiments may have high utilization efficiency of a memory cell array and high operating speed.

BRIEF DESCRIPTION OF THE DRAWINGS

The foregoing and other features and advantages will be apparent from the more particular description of various embodiments, as illustrated in the accompanying drawings in which like reference characters refer to the same or similar parts throughout the different views. The drawings are not necessarily to scale, emphasis instead being placed upon illustrating the principles of the disclosed embodiments. In the drawings:

FIG. 4 is a block diagram illustrating an exemplary multiplexer circuit included in the semiconductor memory device of FIG. 1 in accordance with one embodiment;

FIGS. 5 to 8 are exemplary tables illustrating values which a mode register signal (MRS) stored in registers of the bank selecting circuit of FIG. 3 may have, in accordance with certain embodiments;

FIG. 9 is a diagram illustrating an exemplary memory cell array comprising memory banks undergoing a normal operation, and memory banks undergoing a self-refresh operation;

DETAILED DESCRIPTION OF THE EMBODIMENTS

Figure 1:
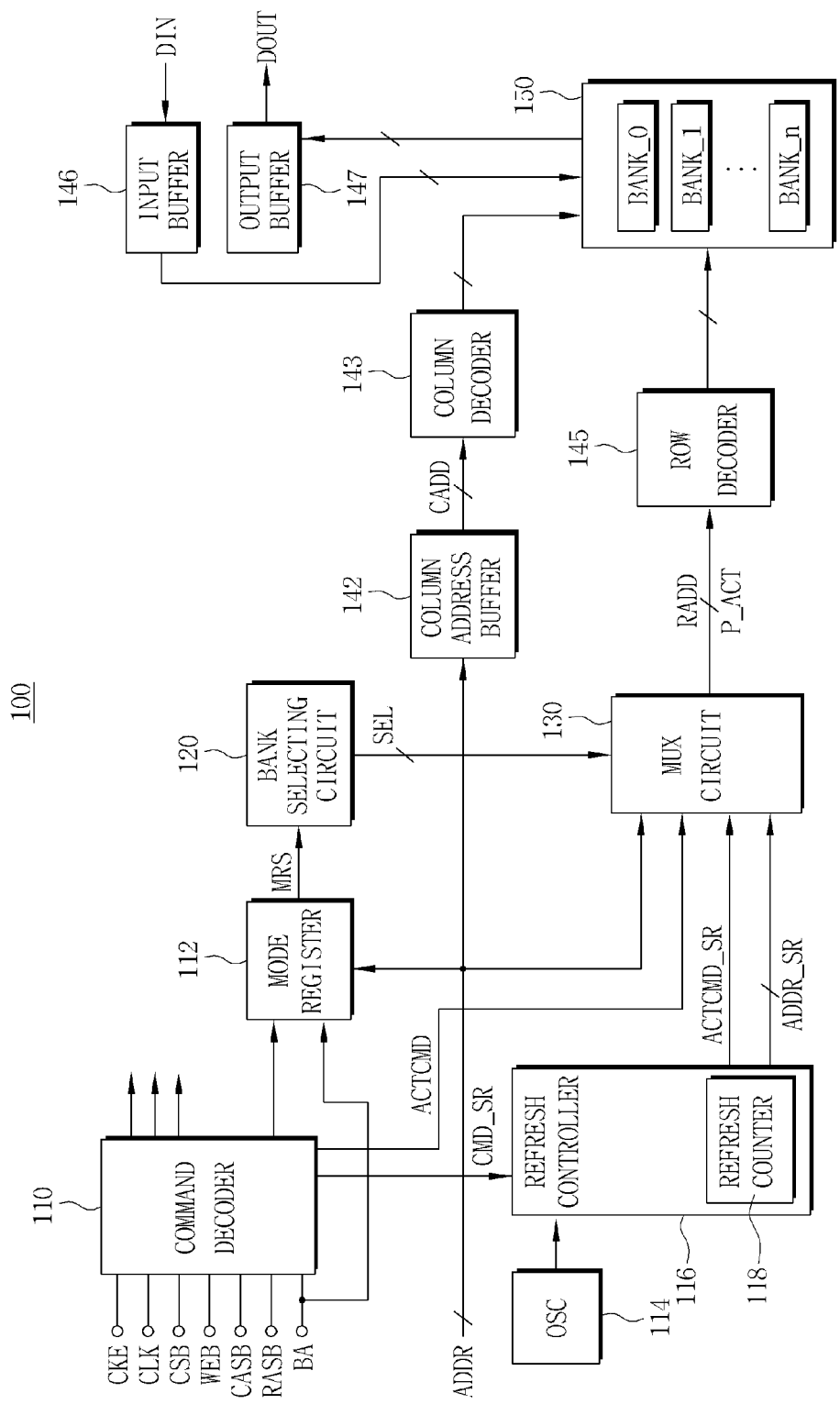
FIG. 1 is a block diagram of an exemplary semiconductor memory device including a refresh circuit in accordance with one embodiment.

Various embodiments will now be described more fully with reference to the accompanying drawings in which some embodiments are shown. The present disclosure, however, be embodied in different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of an exemplary semiconductor memory device 100 including a refresh circuit in accordance with one embodiment.

Referring to FIG. 1, the semiconductor memory device 100 includes a command decoder 110, a mode register 112, an oscillator 114, a refresh controller 116, a bank selecting circuit 120, a multiplexer circuit 130, a column address buffer 142, a column decoder 143, a row decoder 145, an input buffer 146, an output buffer 147 and a memory cell array 150. The semiconductor memory device 100 can include a semiconductor memory chip, and/or a plurality of chips, for example stacked on each other. The semiconductor memory device 100 can include one or more semiconductor packages including one or more chips stacked on a package substrate. The semiconductor device 100 can include a package-on-package device. The refresh controller 116 may include a refresh counter 118, and the memory cell array 150 may include a plurality of memory banks Bank_0, BANK_1, . . . , and BANK_n. Each of the command decoder 110, mode register 112, oscillator 114, refresh controller 116, bank selecting circuit 120, multiplexer circuit 130, column address buffer 142, column decoder 143, row decoder 145, input buffer 146, output buffer 147, and memory cell array 150 includes circuitry configured to perform certain operations, and may be described herein as a circuit.

The command decoder 110 receives a plurality of signals, which may be received from an external source (e.g., an external controller). The signals may include, for example, clock enable signal CKE, a clock signal CLK, a chip selecting signal CSB, a write enable signal WEB, a column address strobe signal CASB, a row address strobe signal RASB, and a bank address BA. The command decoder 110 generates various commands and control signals used for operation of the semiconductor memory device 100 based on the write enable signal WEB, the column address strobe signal CASB, and the row address strobe signal RASB.

The mode register 112 performs programming using the commands, the bank address BA, and an external address ADDR received from the command decoder 110, and stores the programmed contents. The oscillator 114 generates an oscillating signal. The bank selecting circuit 120 receives a mode register signal MRS having information of a memory bank on which a refresh operation is to be performed. The bank selecting circuit 120 generates a selection signal SEL based on the mode register signal MRS. The refresh controller 116 receives a self-refresh command CMD_SR from the command decoder 110, and the oscillating signal from the oscillator 114. The refresh controller 116 may include the refresh counter 118, and generates a self-refresh active command ACTCMD_SR and a self-refresh address ADDR_SR based on the self-refresh command CMD_SR and the oscillating signal.

The self-refresh active command ACTCMD_SR generated by the refresh controller 116 is a signal that indicates a time point at which refresh is internally performed. For example, if a self refresh command CMD_SR is given one time outside of a DRAM that starts a refresh operation, the DRAM will enter a refresh operation mode, and the oscillator will operate in response to the CMD_SR command. In one embodiment, the ACTCMD_SR signal is continuously generated in synchronization with a rising edge or falling edge of a signal from the oscillator, and the self refresh operation will continue until a self refresh exit command is received from outside the semiconductor memory device.

The self-refresh address ADDR_SR is a row address that is used during the self refresh. Because an internal refresh operation is performed based on ACTCMD_SR, the period of ADDR_SR should be changed (increase or decrease) in the same way as the period of ACTCMD_SR. For this, the refresh counter will be driven using an edge of a signal from the oscillator, which follows the same timing as ACTCMD_SR. In general, a pulse of ACTCMD_SR can be used as an increment pulse of the refresh counter.

The multiplexer circuit 130 selects one of an active command ACTCMD and the self-refresh active command ACTCMD_SR in response to bits of the selection signal SEL, generates a row active signal P_ACT based on the selected command, and selects one of an external address ADD_SR and the self-refresh address ADDR_SR to generate a row address RADD. The row decoder 145 decodes the row active signal P_ACT and the row address RADD. The column address buffer 142 generates a column address CADD based on the external address ADDR. The column decoder decodes the column address CADD.

In one embodiment, the multiplexer 130 may be comprised of n sets according to bits of an MRS signal. Each set of the multiplexer 130 generates RADD using upper two inputs ACTCMD and ADDR or using lower two inputs ACTCMD_SR and ADDR_SR according to an MRS state (H or L). The process of generating RADD using ACTCMD and ADDR may include latching a state of ADDR at a rising or falling edge of ACTCMD. Similarly, the process of generating RADD using ACTCMD_SR and ADDR_SR may include latching a state of ADDR_SR at a rising or falling edge of ACTCMD_SR.

The semiconductor memory device 100 may store data in the memory cell array 150, or output data from the memory cell array 150 based on an output signal of the row decoder 145 and an output signal of the column decoder 143. The input buffer 145 buffers data DIN input to the semiconductor memory device 100, and the output buffer 147 buffers data DOUT output from the semiconductor memory device 100.

While parts of the memory banks of the semiconductor memory device undergo a refresh operation based on the output signal of the row decoder 145, the rest of the memory banks may undergo a normal operation. The normal operation may include an active operation, a write operation, a read operation, and a pre-charge operation.

When the memory cell array 150 of the semiconductor memory device 100 includes a first memory bank group, a second memory bank group, while the first memory bank group undergoes a refresh operation, undergoes a normal operation.

The semiconductor memory device 100 of FIG. 1 may include a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof.

Figure 2:
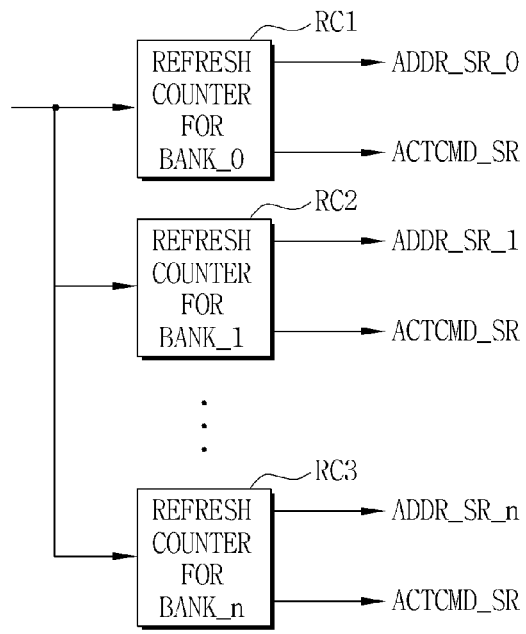
FIG. 2 is a block diagram illustrating an exemplary refresh counter of a refresh controller included in the semiconductor memory device of FIG. 1, in accordance with one embodiment.

FIG. 2 is a block diagram illustrating a refresh counter 118 of a refresh controller 116 included in the semiconductor memory device 100 of FIG. 1, in accordance with one exemplary embodiment.

Referring to FIG. 2, the refresh counter 118 may include refresh counters RC1, RC2 and RC3 for the respective memory banks BANK_0, BANK_1, . . . , BANK_n included in the memory cell array 150. The refresh counter RC1 for BANK_0 generates the self-refresh active command ACTCMD_SR and a self-refresh address ADDR_SR_0 based on the self-refresh command CMD_SR. The refresh counter RC2 for BANK_1 generates the self-refresh active command ACTCMD_SR and a self-refresh address ADDR_SR_1 based on the self-refresh command CMD_SR. The refresh counter RC3 for BANK_n generates the self-refresh active command ACTCMD_SR and a self-refresh address ADDR_SR_n based on the self-refresh command CMD_SR.

Figure 3:
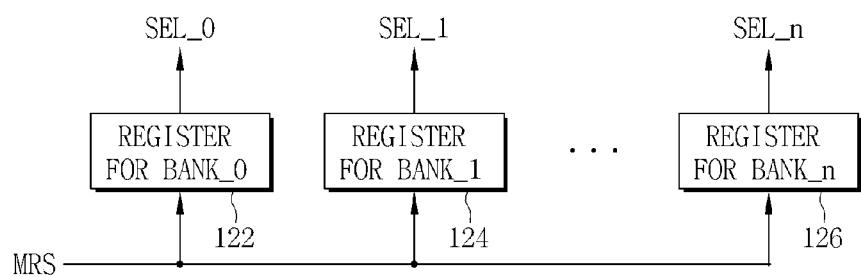
FIG. 3 is a block diagram illustrating an exemplary bank selecting circuit included in the semiconductor memory device of FIG. 1 in accordance with one embodiment.

FIG. 3 is a block diagram illustrating a bank selecting circuit 120 included in the semiconductor memory device 100 of FIG. 1 in accordance with an exemplary embodiment.

Referring to FIG. 3, the bank selecting circuit 120 may include registers 122, 124 and 126 for the respective memory banks BANK_0, BANK_1, . . . , BANK_n included in the memory cell array 150. The register 122 for BANK_0 generates a first bit SEL_0 of the selection signal SEL based on the mode register signal MRS. The register 124 for BANK_1 generates a second bit SEL_1 of the selection signal SEL based on the mode register signal MRS. The register 126 for BANK_n generates an $n^{th}$ bit SEL_n of the selection signal SEL based on the mode register signal MRS.

FIG. 4 is a block diagram illustrating a multiplexer circuit 130 included in the semiconductor memory device 100 of FIG. 1, in accordance with an exemplary embodiment.

Referring to FIG. 4, the multiplexer circuit 130 may include multiplexers 132, 134 and 136 for the respective memory banks BANK_0, BANK_1, . . . , BANK_n included in the memory cell array 150. The multiplexer 132 for BANK_0 selects one of the active command ACTCMD and the self-refresh active command ACTCMD_SR in response to the first bit SEL_1 of the selection signal SEL, generates a row active signal P_ACT_0 based on the selected command, and selects one of the external address ADDR and the self-refresh address ADDR_SR to generate a first bit RADD_0 of a row address. The multiplexer 134 for BANK_1 selects one of the active command ACTCMD and the self-refresh active command ACTCMD_SR in response to the second bit SEL_2 of the selection signal SEL, generates a row active signal P_ACT_1 based on the selected command, and selects one of the external address ADDR and the self-refresh address ADDR_SR to generate a second bit RADD_1 of the row address. The multiplexer 136 for BANK_n selects one of the active command ACTCMD and the self-refresh active command ACTCMD_SR in response to the $n^{th}$ bit SEL_n of the selection signal SEL, generates a row active signal P_ACT_n based on the selected command, and selects one of the external address ADDR and the self-refresh address ADDR_SR to generate an $n^{th}$ bit RADD_n of the row address.

FIGS. 5 to 8 are tables illustrating values which a mode register signal (MRS) stored in registers of the bank selecting circuit 120 of FIG. 3 may have, in accordance with certain exemplary embodiments.

Referring to FIG. 5, a first bit MRS_B0 of the mode register signal is stored in a first register REG0, a second bit MRS_B1 of the mode register signal is stored in a second register REG1, a third bit MRS_B2 of the mode register signal is stored in a third register REG2, a fourth bit MRS_B3 of the mode register signal is stored in a fourth register REG3, a fifth bit MRS_B4 of the mode register signal is stored in a fifth register REG4, a sixth bit MRS_B5 of the mode register signal is stored in a sixth register REG5, a seventh bit MRS_B6 of the mode register signal is stored in a seventh register REG6, and an eighth bit MRS_B7 of the mode register signal is stored in an eighth register REG7.

In the table 120a of FIG. 5, all the bits MRS_B0, MRS_B1, MRS_B2, MRS_B3, MRS_B4, MRS_B5, MRS_B6, MRS_B7 have logic 0.

In the table 120b of FIG. 6, all the bits MRS_B0, MRS_B1, MRS_B2, MRS_B3, MRS_B4, MRS_B5, MRS_B6, MRS_B7 have logic 1.

In the table 120c of FIG. 7, bits MRS_B0, MRS_B1, MRS_B2, and MRS_B3 have logic 0, and bits MRS_B4, MRS_B5, MRS_B6, and MRS_B7 have logic 1.

Figures 8, 9:
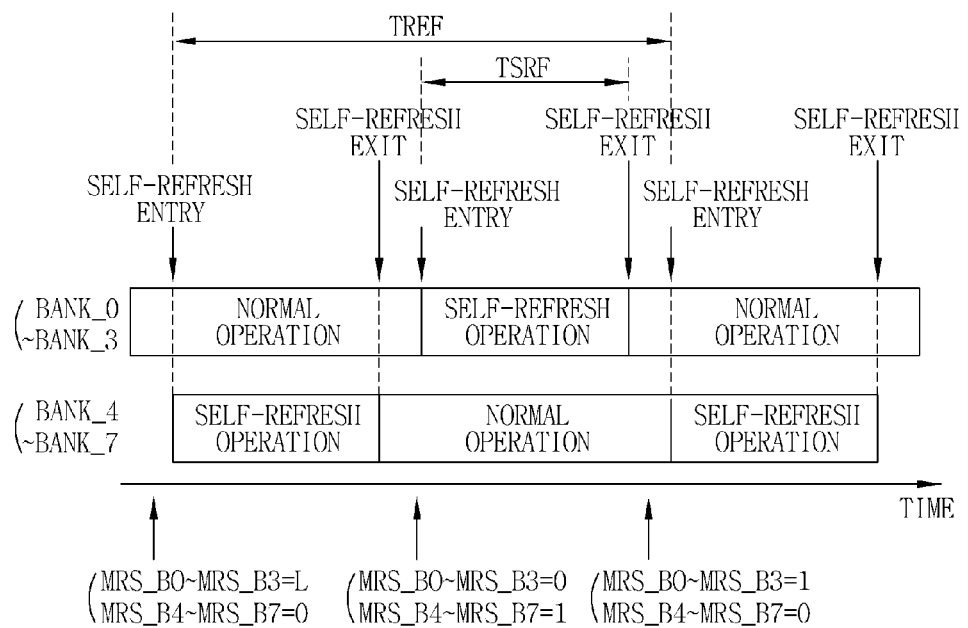

In the table 120d of FIG. 8, bits MRS_B0, MRS_B1, MRS_B2, and MRS_B3 have logic 1, and bits MRS_B4, MRS_B5, MRS_B6, and MRS_B7 have logic 0.

In the semiconductor memory device 100 of FIG. 1, in one embodiment, memory banks included in the memory cell array 150 may undergo a refresh operation when bits of the mode register signal have logic 0. On the contrary, memory banks included in the memory cell array 150 may undergo a normal operation when bits of the mode register signal have logic 1. The normal operation may include, for example, an active operation, a write operation, a read operation, and a pre-charge operation.

As shown in FIG. 5, when all the bits MRS_B0, MRS_B1, MRS_B2, MRS_B3, MRS_B4, MRS_B5, MRS_B6, MRS_B7 of the mode register signal have logic 0, all the memory banks included in the in the memory cell array 150 may undergo a refresh operation. As shown in FIG. 6, when all the bits MRS_B0, MRS_B1, MRS_B2, MRS_B3, MRS_B4, MRS_B5, MRS_B6, MRS_B7 of the mode register signal have logic 1, all the memory banks included in the in the memory cell array 150 may undergo a normal operation.

As shown in FIG. 7, when bits MRS_B0, MRS_B1, MRS_B2, and MRS_B3 of the mode register signal have logic 0, and bits MRS_B4, MRS_B5, MRS_B6, and MRS_B7 of the mode register signal have logic 1, memory banks that operate based on the first to fourth bits MRS_B0, MRS_B1, MRS_B2, and MRS_B3 of the mode register signal may undergo the refresh operation, and memory banks that operate based on the fifth to eighth bits MRS_B4, MRS_B5, MRS_B6, and MRS_B7 of the mode register signal may undergo the normal operation.

As shown in FIG. 8, when bits MRS_B0, MRS_B1, MRS_B2, and MRS_B3 of the mode register signal have logic 1, and bits MRS_B4, MRS_B5, MRS_B6, and MRS_B7 of the mode register signal have logic 0, memory banks that operate based on the first to fourth bits MRS_B0, MRS_B1, MRS_B2, and MRS_B3 of the mode register signal may undergo the normal operation, and memory banks that operate based on the fifth to eighth bits MRS_B4, MRS_B5, MRS_B6, and MRS_B7 of the mode register signal may undergo the refresh operation.

The selection signal SEL generated by the bank selecting circuit 120 may be generated based on the mode register signal MRS. Therefore, the semiconductor memory device according to the disclosed embodiments may perform the refresh operation with respect to parts of the memory banks of a memory cell array, and may perform the normal operation with respect to the rest of the memory banks of the memory cell array.

FIG. 9 is a diagram illustrating an exemplary memory cell array comprising memory banks undergoing a normal operation, and memory banks undergoing a self-refresh operation.

Referring to FIG. 9, when memory banks BANK_0 to BANK_3 of a memory cell array undergo the normal operation, memory banks BANK_4 to BANK_7 of the memory cell array undergo the refresh operation. Further, when memory banks BANK_0 to BANK_3 of a memory cell array undergo the refresh operation, memory banks BANK_4 to BANK_7 of the memory cell array undergo the normal operation.

The semiconductor memory device according to certain embodiments may perform the refresh operation with respect to a half of the memory banks of a memory cell array, and may perform the normal operation with respect to another half of the memory banks of the memory cell array.

The self-refresh command CMD_SR may have information on self-refresh entry time and self-refresh exit time with respect to memory banks. The time needed to refresh the memory banks that undergo the refresh operation (TSRF), may be from the self-refresh entry time to the self-refresh exit time. There may be a partial overlap of normal operation time periods between the memory banks BANK_0 to BANK_3 and memory banks BANK_4 to BANK_7.

Data retention time (TREF) of the semiconductor memory device 100 may be a sum of the time for the memory banks BANK_0 to BANK_3 to undergo the refresh operation, and a time for the memory banks BANK_4 to BANK_7 to undergo the normal operation. Data retention time (TREF) of the semiconductor memory device 100 may be longer than the time needed to refresh the memory cells included in the first memory bank group including memory banks BANK_0 to BANK_3 once.

Figure 10:
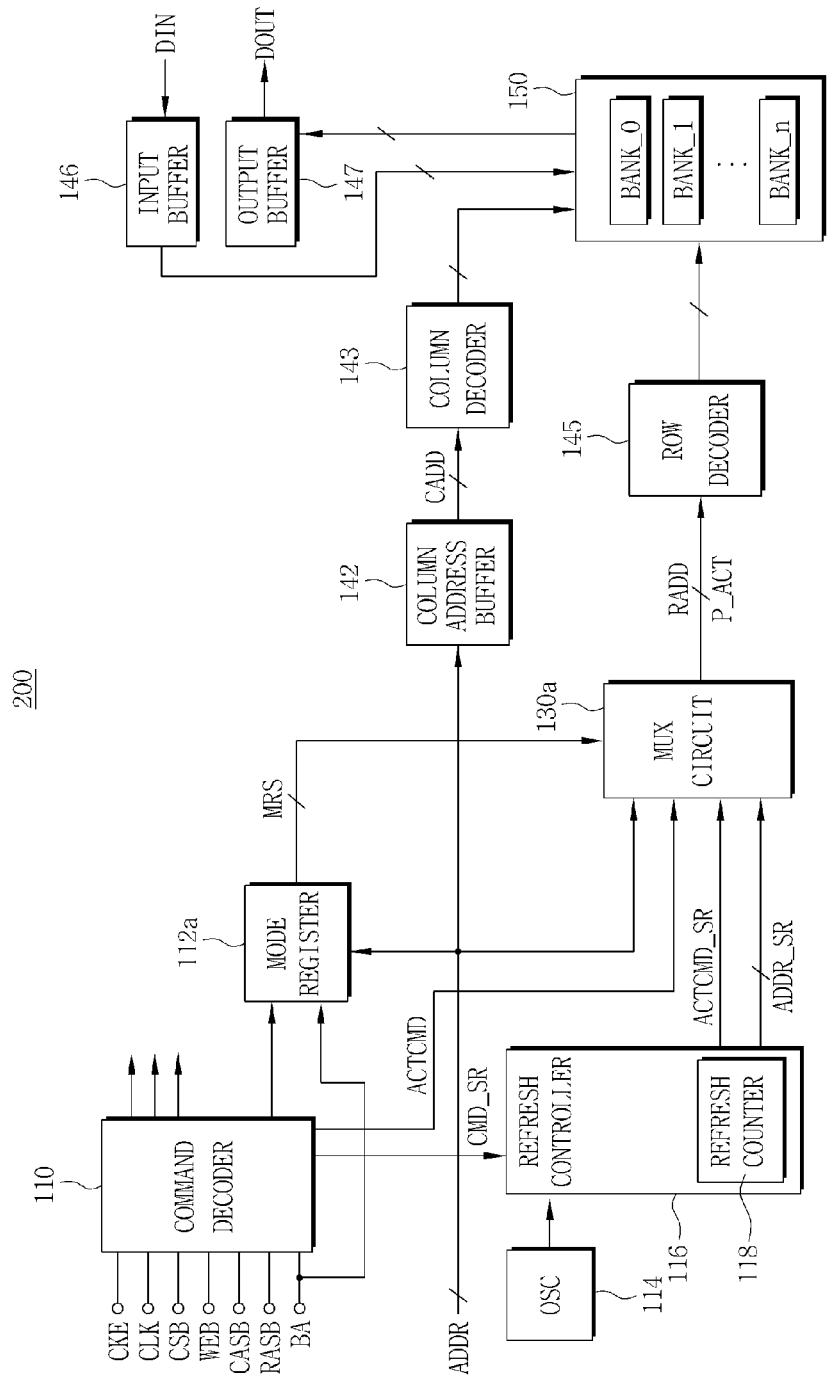
FIG. 10 is a block diagram of an exemplary semiconductor memory device including a refresh circuit in accordance with another embodiment.

FIG. 10 is a block diagram of a semiconductor memory device 200 including a refresh circuit in accordance with another exemplary embodiment.

The semiconductor memory device 200 shown in FIG. 10 does not include a bank selecting circuit 120, different from the semiconductor memory device 100 of FIG. 1. In FIG. 10, the mode register 112a may include a plurality of registers. The number of registers may be determined according to the number of memory banks included in the semiconductor memory device. For example, when N banks are included in the semiconductor memory device, the number of registers may be N or log$_2$N. Each of the registers may be used as a flag that determines whether each bank operates in a self refresh mode or executes a normal active command.

The multiplexer circuit 130a selects one of an active command ACTCMD and the self-refresh active command ACTCMD_SR in response to bits of the mode register signal MRS, generates a row active signal P_ACT based on the selected command, and selects one of an external address ADD_SR and the self-refresh address ADDR_SR to generate a row address RADD. The row decoder 145 decodes the row active signal P_ACT and the row address RADD. The column address buffer 142 generates a column address CADD based on the external address ADDR. The column decoder decodes the column address CADD.

Figure 11:
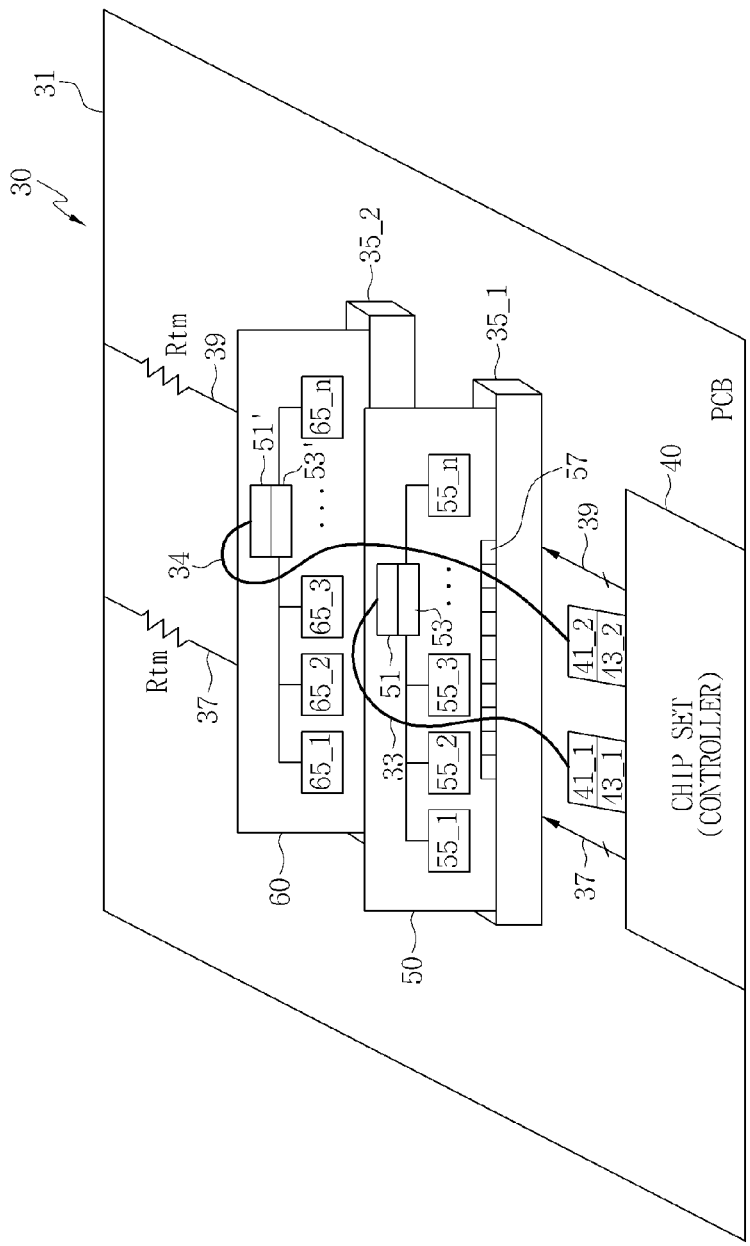
FIG. 11 is a block diagram of an example of a memory system including a semiconductor memory device in accordance with certain embodiments.

FIG. 11 is a block diagram of an example of a memory system 30 including a semiconductor memory device in accordance with certain exemplary embodiments.

Referring to FIG. 11, the memory system 30 may include a motherboard 31, a chip set (or a controller) 40, slots 35_1 and 35_2, memory modules 50 and 60, and transmission lines 33 and 34. Buses 37 and 39 connect the chip set 40 with the slots 35_1 and 35_2. A terminal resistor Rtm may terminate each of the buses 37 and 39 on a PCB of the motherboard 31.

For convenience, in FIG. 11, only two slots 35_1 and 35_2 and two memory modules 50 and 60 are shown. However, the memory system 30 may include an arbitrary number of slots and memory modules.

The chip set 40 may be mounted on the PCB of the motherboard 31, and control the operation of the memory system 30. The chip set 40 may include connectors 41_1 and 41_2 and converters 43_1 and 43_2.

The converter 43_1 receives parallel data generated by the chip set 40, converts the parallel data to serial data, and outputs the serial data to the transmission line 33 via the connector 41_1. The converter 43_1 receives serial data via the transmission line 33, and converts the serial data to parallel data and outputs the parallel data to the chip set 40.

The converter 43_2 receives parallel data generated by the chip set 40, converts the parallel data to serial data, and outputs the serial data to the transmission line 34 via the connector 41_2. The converter 43_2 receives serial data via the transmission line 34, and converts the serial data to parallel data and outputs the parallel data to the chip set 40. In one embodiment, the transmission lines 33 and 34 included in the memory system 30 may be a plurality of optical fibers. However, in other embodiments, they may be electrical wires.

The memory module 50 may include a plurality of memory devices 55_1 to 55_n, a first connector 57, a second connector 51, and a converter 53. The memory module 60 may include a plurality of memory devices 65_1 to 65_n, a first connector 57', a second connector 51', and a converter 53'.

The first connector 57 may transfer low-speed signals received from the chip set 40 to the memory devices 55_1 to 55_n, and the second connector 51 may be connected to the transmission line 33 for transferring high-speed signals.

The converter 53 receives serial data via the second connector 51, converts the serial data to parallel data, and outputs the parallel data to the memory devices 55_1 to 55_n. Further, the converter 53 receives parallel data from the memory devices 55_1 to 55_n, converts the parallel data to serial data, and outputs the serial data to the second connector 51.

The memory devices 55_1 to 55_n and 65_1 to 65_n may include a semiconductor memory device according to certain embodiments. Therefore, the memory devices 55_1 to 55_n and 65_1 to 65_n may include an internal voltage generating circuit according to embodiments described above.

The memory devices 55_1 to 55_n and 65_1 to 65_n may be a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof.

Figure 12:
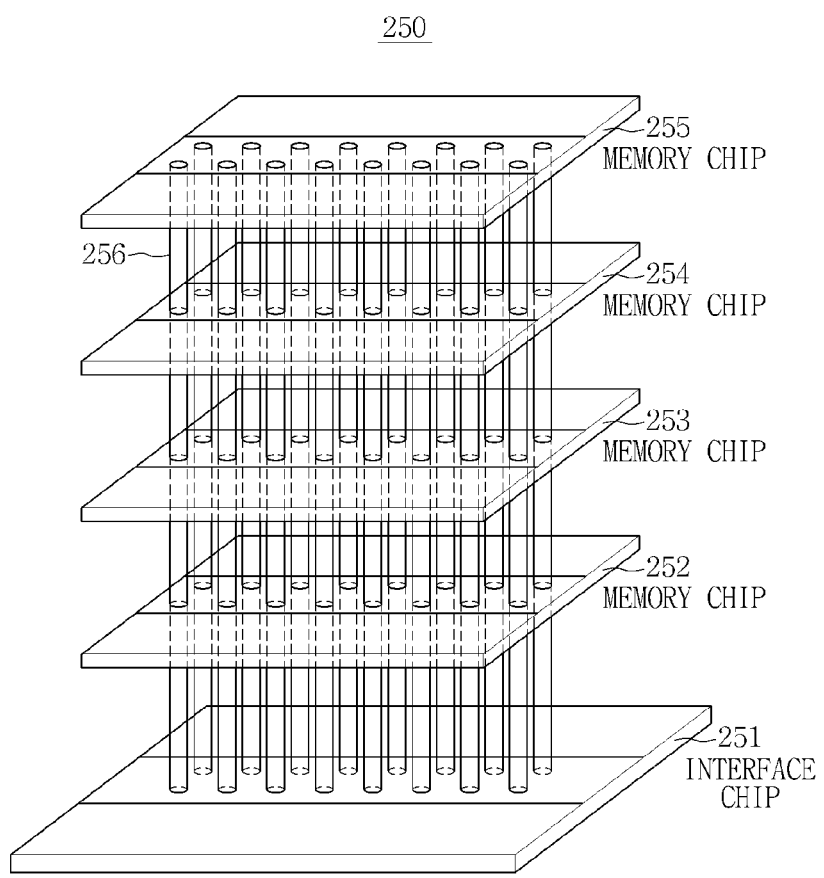
FIG. 12 is a diagram of an example of a stacked semiconductor device including a semiconductor memory device including an internal voltage generating circuit according to certain embodiments.

FIG. 12 is a diagram of an example of a stacked semiconductor device 250 including a semiconductor memory device 100 according to certain exemplary embodiments.

Referring to FIG. 12, the stacked semiconductor device 250 may include an interface chip 251, and memory chips 252, 253, 254 and 255 which are electrically connected through through substrate vias, such as through-silicon vias 256. Although the through-silicon vias 256 disposed in two rows are shown in FIG. 12, the stack semiconductor device 250 may include any number of through-substrate vias or rows of through-substrate vias.

The memory chips 252, 253, 254 and 255 included in the stacked semiconductor device 250 may include the refresh circuit in accordance with the embodiments as described above. The interface chip 251 performs an interface between the memory chips 252, 253, 254 and 255 and external devices.

Figure 13:
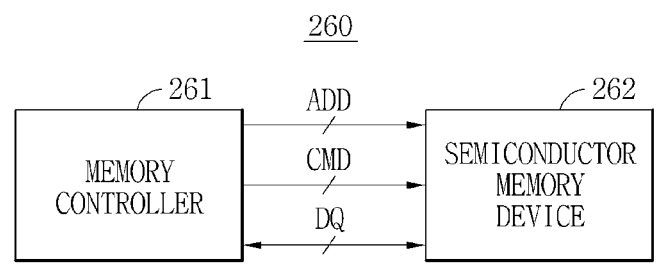
FIG. 13 is a block diagram of another example of a memory system including a semiconductor memory device in accordance with certain embodiments.

FIG. 13 is a block diagram of another example of a memory system 260 including a semiconductor memory device 100 in accordance with another exemplary embodiment.

Referring to FIG. 13, the memory system 260 includes a memory controller 261 and a semiconductor memory device 262.

The memory controller 261 generates address signals ADD and command signals CMD and provides the address signals ADD and the command signals CMD to the semiconductor memory device 262 through buses. Data DQ may be transmitted from the memory controller 261 to the semiconductor memory device 262 through the buses, or transmitted from the semiconductor memory device 262 to the memory controller 261 through the buses.

The semiconductor memory device 262 may include the refresh circuit according to embodiments described above.

Figure 14:
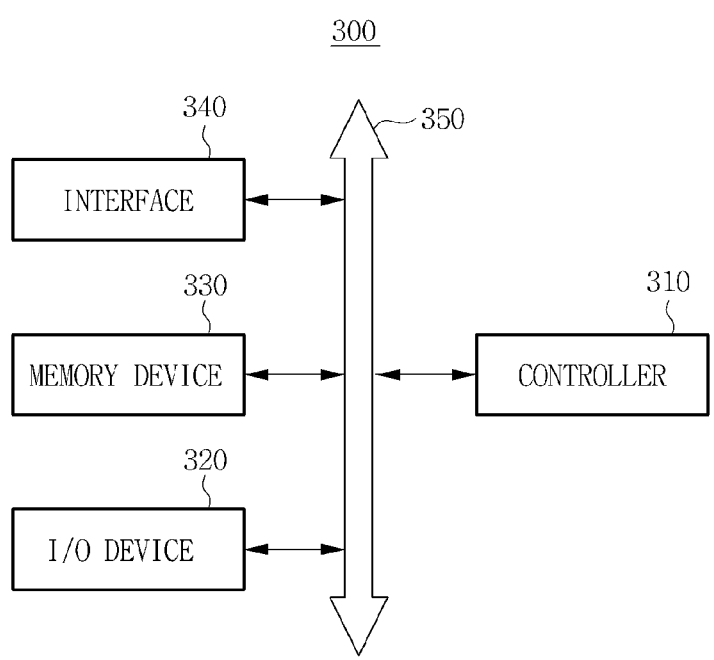
FIG. 14 is a block diagram of an example of an electronic system including a semiconductor memory device in accordance with certain embodiments.

FIG. 14 is a block diagram of an example of an electronic system 300 including a semiconductor memory device 100 in accordance with the disclosed embodiments.

Referring to FIG. 14, the electronic system 300 in accordance with one embodiment may include a controller 310, an input and output device 320, a memory device 330, an interface 340, and a bus 350. The memory device 330 may be a semiconductor memory device including the refresh circuit in accordance with embodiments such as described above. The bus 350 may function to provide a path in that data is mutually moved among the controller 310, the input and output device 320, the memory device 330, and the interface 340.

The controller 310 may include any one of logic devices that can perform functions, for example, of at least one of a microprocessor, a digital signal processor, and a microcontroller, or functions similar to those. The input and output device 320 may include, for example, at least one selected from a key pad, key board, and a display device. The memory device 330 may function to store data and/or instructions performed by the controller 310.

The memory device 330 may include a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof. The memory device 330 may be the semiconductor memory device including the refresh circuit in accordance with the disclosed embodiments.

The interface 340 may function to transmit/receive data to/from a communication network. The interface 340 can include, for example, an antenna, wired or wireless transceivers or the like to transmit and receive data by wires or wirelessly. In addition, the interface 340 can include optical fibers to transmit and receive data through the optical fibers. The electronic system 300 may be further provided with an application chipset, a camera image processor, and an input and output device.

The electronic system 300 may be implemented as a mobile system, personal computer, an industrial computer, or a logic system that can perform various functions. For example, the mobile system may be any one of a personal digital assistant (PDA), a portable computer, a web tablet, a mobile phone, a wireless phone, a laptop computer, a memory card, a digital music system, and an information transmitting/receiving system. If the electronic system 300 is an apparatus that can perform wireless communication, the electronic system 300 may be used in a communication system such as a Code Division multiple Access (CDMA), a Global System for Mobile communication (GSM), a North American Digital Cellular (NADC), an Enhanced-Time Division Multiple Access (E-TDMA), a Wideband Code Division Multiple Access (WCDMA), or a CDMA 2000.

Figure 15:
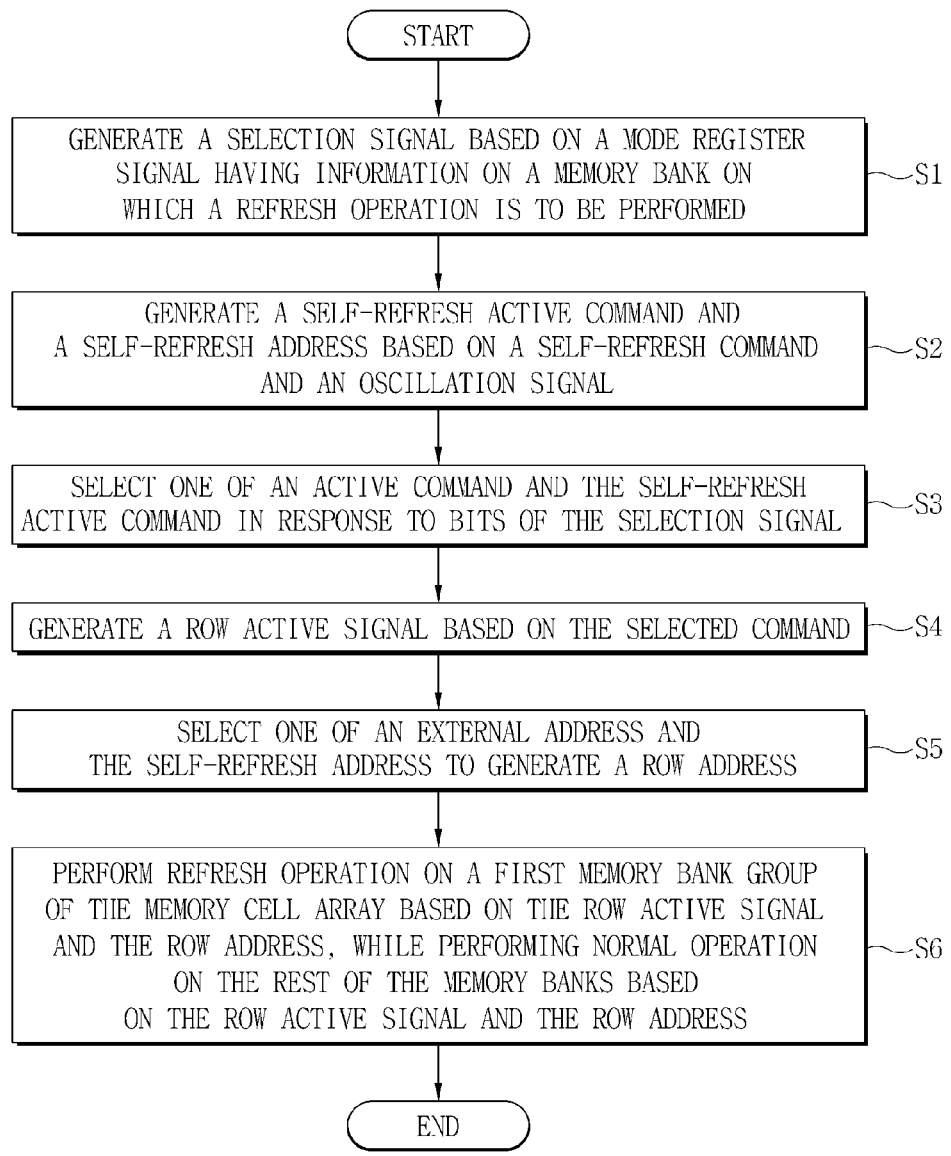
FIG. 15 is a flow chart illustrating an exemplary refresh control method of a semiconductor memory device in accordance with certain embodiments.

FIG. 15 is a flow chart illustrating a refresh control method of a semiconductor memory device in accordance with an exemplary embodiment.

Referring to FIG. 15, the method of generating an internal voltage in accordance with one embodiments may include the following operations:

(1) generating a selection signal based on a mode register signal having information on a memory bank on which a refresh operation is to be performed (S1).

(2) generating a self-refresh active command and a self-refresh address based on a self-refresh command and an oscillation signal (S2).

(3) selecting one of an active command and the self-refresh active command in response to bits of the selection signal (S3).

(4) generating a row active signal based on the selected command (S4).

(5) selecting one of an external address and the self-refresh address to generate a row address (S5).

(6) performing a refresh operation on a first memory bank group of the memory cell array based on the row active signal and the row address, while performing a normal operation on the rest of the memory banks based on the row active signal and the row address (S6).

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that modifications to the disclosed embodiments, as well as other embodiments, are intended to be included within the scope of the appended claims.

What is claimed is:

1. A refresh circuit of a semiconductor memory device, the refresh circuit comprising:
   a mode register configured to generate a mode register signal having information related to a memory bank on which a self-refresh operation is to be performed;
   a refresh controller configured to generate a self-refresh active command and a self-refresh address based on a self-refresh command and an oscillation signal; and
   a multiplexer circuit including a plurality of multiplexers, each of the multiplexers configured to select one of an active command and the self-refresh active command in response to bits of the mode register signal, configured to generate a row active signal based on the selected command, and configured to select one of an external address and the self-refresh address to generate a row address.

2. The circuit according to claim 1, further comprising:
a bank selecting circuit configured to generate a selection signal based on the mode register signal and to provide the selection signal to the multiplexer.

3. The circuit according to claim 2, wherein the bank selecting circuit includes registers for storing bits of the mode register signal.

4. The circuit according to claim 1, wherein each of the memory banks of the semiconductor memory device is configured to be activated based on the row active signal and the row address generated by each of the multiplexers of the multiplexer circuit.

5. The circuit according to claim 4, wherein the circuit is configured to cause parts of the memory banks of the semiconductor memory device to undergo a self-refresh operation, while the rest of the memory banks undergo a normal operation.

6. The circuit according to claim 5, wherein the normal operation includes at least one of an active operation, a write operation, a read operation, and a pre-charge operation.

7. The circuit according to claim 4, wherein when the semiconductor memory device includes a first memory bank group and a second memory bank group, the semiconductor memory device is configured such that while the first memory bank group undergoes a self-refresh operation, the second memory bank group undergoes a normal operation.

8. The circuit according to claim 7, wherein data retention time of the semiconductor memory device is a sum of a time for the first memory bank group to undergo the self-refresh operation, and a time for the second memory bank group to undergo the normal operation.

9. The circuit according to claim 7, wherein data retention time of the semiconductor memory device is configured to be longer than the time needed to once refresh all the memory cells included in the first memory bank group.

10. The circuit according to claim 4, wherein among the bits of the selection signal, the a memory bank corresponding to a bit having a first logic state undergoes a self-refresh operation, and a memory bank corresponding to a bit having a second logic state undergoes a normal operation.

11. The circuit according to claim 1, wherein the self-refresh command has information on a self-refresh entry time and a self-refresh exit time with respect to each memory bank.

12. The circuit according to claim 11, wherein memory banks undergoing a self-refresh operation are configured to enter a self-refresh mode and exit the self-refresh mode at least once during a data retention time.

13. A semiconductor memory device comprising:
a memory cell array having a plurality of memory banks;
a mode register configured to generate a mode register signal having information related to a memory bank on which a self-refresh operation is to be performed;
a refresh controller configured to generate a self-refresh active command and a self-refresh address based on a self-refresh command and an oscillation signal;
a multiplexer circuit configured to select one of an active command and the self-refresh active command in response to bits of the mode register signal, configured to generate a row active signal based on the selected command, and configured to select one of an external address and the self-refresh address to generate a row address;
a row decoder configured to decode the row active signal and the row address;
a column address buffer configured to generate a column address based on the external address; and
a column decoder configured to decode the column address,
wherein the semiconductor memory device is configured such that while parts of the memory banks of the semiconductor memory device undergo a self-refresh operation, the rest of the memory banks undergo a normal operation based on an output signal of the row decoder.

14. The semiconductor memory device according to claim 13, wherein the self-refresh command has information on a self-refresh entry time and a self-refresh exit time with respect to each memory bank.

15. The semiconductor memory device according to claim 13, wherein the semiconductor memory device is configured such that while a first memory bank group of the memory cell array undergoes a self-refresh operation, the rest of the memory bank groups undergoes a normal operation based on an output signal of the row decoder.

16. A refresh method of a semiconductor memory device, the refresh method comprising:
generating a mode register signal having information relating to a memory bank on which a self-refresh operation is to be performed;
generating a self-refresh active command and a self-refresh address based on a self-refresh command and an oscillation signal; and
for each of a plurality of multiplexers:
selecting, by the multiplexer, one of an active command and the self-refresh active command in response to bits of the mode register signal,
generating, by the multiplexer, a row active signal based on the selected command, and
selecting one of an external address and the self-refresh address to generate a row address.

17. The method according to claim 16, further comprising:
generating a selection signal based on the mode register signal and providing the selection signal to the multiplexer.

18. The method according to claim 17, further comprising storing bits of the mode register signal in registers of the bank selecting circuit.

19. The method according to claim 16, further comprising activating each of the memory banks of the semiconductor memory device based on the row active signal and the row address generated by each of the multiplexers.

20. The method according to claim 19, wherein while parts of the memory banks of the semiconductor memory device undergo a self-refresh operation, the rest of the memory banks undergo a normal operation.

* * * * *